(12) United States Patent
Gerpheide et al.

(10) Patent No.: US 6,680,731 B2
(45) Date of Patent: Jan. 20, 2004

(54) FLEXIBLE TOUCHPAD SENSOR GRID FOR CONFORMING TO ARCUATE SURFACES

(75) Inventors: George Gerpheide, Salt Lake City, UT (US); Brian Taylor, Sandy, UT (US); Richard Woolley, Orem, UT (US); Daniel Lee, Salt Lake City, UT (US)

(73) Assignee: Cirque Corporation, Salt Lake City, UT (US)

( * ) Notice: Subject to any disclaimer, the term of this patent is extended or adjusted under 35 U.S.C. 154(b) by 204 days.

(21) Appl. No.: 09/759,609

(22) Filed: Jan. 11, 2001

(65) Prior Publication Data

US 2001/0055004 A1 Dec. 27, 2001

Related U.S. Application Data

(60) Provisional application No. 60/175,586, filed on Jan. 11, 2000.

(51) Int. Cl.⁷ .................................................. G09G 5/00
(52) U.S. Cl. ........................ 345/173; 345/179; 345/174
(58) Field of Search ................................. 345/173, 179, 345/174, 175, 156

(56) References Cited

U.S. PATENT DOCUMENTS

| | | | |
|---|---|---|---|
| 4,013,835 A | 3/1977 | Eachus et al. | |
| 4,228,330 A | * 10/1980 | Larson | 200/5 A |
| 4,413,252 A | * 11/1983 | Tyler et al. | 341/33 |
| 4,687,885 A | 8/1987 | Talmage, Jr. et al. | |
| RE33,740 E | 11/1991 | Taguchi et al. | |
| 5,081,406 A | 1/1992 | Hughes et al. | |
| 5,159,159 A | 10/1992 | Asher | |
| 5,360,949 A | * 11/1994 | Duxbury | 174/250 |
| 5,747,757 A | 5/1998 | Van Zeeland et al. | |
| 5,844,506 A | 12/1998 | Binstead | |
| 5,942,733 A | 8/1999 | Allen et al. | |
| 6,002,389 A | * 12/1999 | Kasser | 345/173 |
| 6,002,594 A | 12/1999 | Ledin et al. | |
| 6,137,427 A | 10/2000 | Binstead | |

* cited by examiner

Primary Examiner—Steven Saras
Assistant Examiner—Fritz Alphonse
(74) Attorney, Agent, or Firm—Morriss O'Bryant Compagni, P.C.

(57) ABSTRACT

A touchpad formed from the combination of a flexible and non-conductive material used for a touch-sensitive surface, and a PC board on which is mounted the touchpad circuitry, wherein touchpad sensing electrodes are disposed on the touch-sensitive surface by creating electrical traces formed from conductive ink, the touch-sensitive surface being capable of conforming to various arcuate surfaces, and being capable of sensing through a protective housing such that the touch-sensitive surface is protected, and does not come in direct contact with the pointing object.

17 Claims, 5 Drawing Sheets

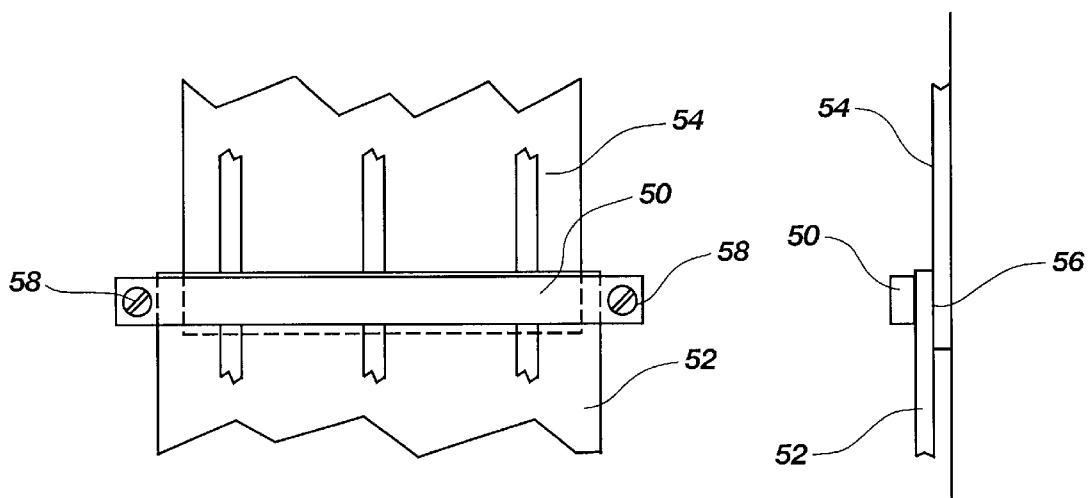
Fig. 5A
*(PRIOR ART)*
Fig. 5B
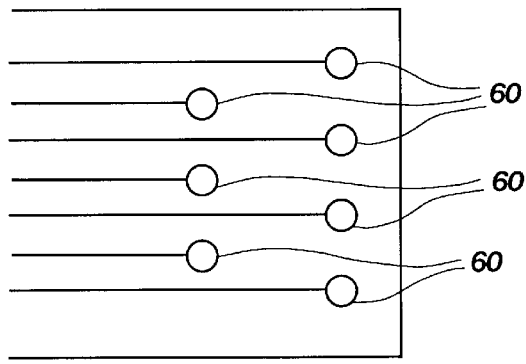
Fig. 7
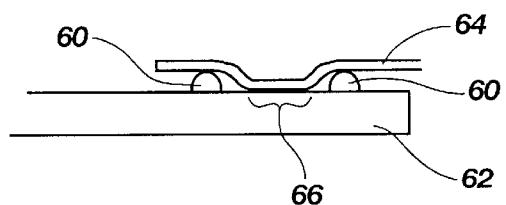
Fig. 6

FLEXIBLE TOUCHPAD SENSOR GRID FOR CONFORMING TO ARCUATE SURFACES

CROSS REFERENCE TO RELATED APPLICATIONS

This document claims priority to, and incorporates by reference, all of the subject matter included in the provisional patent application filed on Jan. 11, 2000, and having Ser. No. 60/175,586.

BACKGROUND

1. The Field of the Invention

This invention relates generally to combining computer input devices such as keyboards and touchpads. More specifically, the invention relates to combining the existing components of a keyboard and an integrally constructed touchpad, and for an improved system for coupling a PC board with touchpad circuitry to the keyboard components. The invention also relates to combining a flexible sensor portion of a touchpad, and the rigid circuit component portion of the touchpad, to each other

2. The State of the Art

The prior art includes systems which provide a computer input device having an integrated touchpad. For example, the prior art includes kiosks, computer keyboards, and information appliances that utilize touchpads as an input interface. Probably the most common device is a computer keyboard. It is well known in the art of keyboards and touchpads that they can be included within a same keyboard case or chassis. For example, FIG. 1 shows a top view of a typical QWERTY arranged keyboard 10 from the prior art which has moved the 10-key numeric pad 12 closer to the letter keys, and disposed a touchpad 14 into its place.

FIG. 2 is another keyboard 18 from the prior art which utilizes an ergonomic design. These keyboards 18 have a touchpad 20 disposed beneath the keys in a wrist resting area. This arrangement enables the 10-key keypad 22 to remain in its most familiar location in the keyboard 18.

Unfortunately, disposing a touchpad into a keyboard is not always a straightforward task for some important reasons. For example, it is obviously desirable to make keyboards as inexpensively as possible. While touchpads also have component costs, they also have certain configuration requirements that are different and often more costly than those of keyboards. These aspects will be discussed after explaining the internal structure of a typical prior art keyboard.

FIG. 3 is provided to illustrate one method of manufacturing the internal structure of keyboards. In this figure, the internal layout of the keyboard is shown as being made using several layers of sheets made from a plastic-like material such as mylar. The sheets are generally non-conductive in nature. A first sheet 30 has a plurality of electrical traces 32 laid out using a conductive material such as carbon ink or silver ink. The electrical traces 32 intersect locations that keys make contact with on the first sheet 30 when the keys of a keyboard are depressed. The ink can also be disposed on the mylar using a simple silk screening process.

It is important to understand that this ink application process is not extremely precise, and therefore is generally used in processes where tolerances are high, such as on keyboard electrical traces. The third mylar sheet 36 also has electrical traces 38 which intersect each of the locations of the keys of the keyboard as do the electrical traces 32 of the first sheet 30, but typically in a different axis.

The second or middle mylar sheet 40 is used to separate the first sheet 30 from the third sheet 36 when a key is not being pressed. A plurality of holes 42 are made in the second sheet 40 which also correspond to the locations of keys of the keyboard. Thus, when a key is pressed, an electrical trace 32 on the first sheet 30 is pressed into contact with an electrical trace 38 on the third sheet 36 as made possible because of a corresponding hole 42 in the middle or third sheet 36. This pressing together of a set of electrical traces 32, 38 at a unique location completes an electrical path which is sensed by keyboard circuitry in order to determine which key was pressed. The keyboard circuitry is at least one integrated circuit which is located on a PC board which is separate from the plastic sheets 30, 36, 40.

Having explained typical internal structure and operation of a prior art keyboard, the addition of a touchpad complicates construction because touchpads typically require a rigid PC board as part of the sensing circuitry. For example, a capacitance sensitive touchpad generally requires a PC board to be used as the surface upon which sensing electrodes are disposed. The reason for using the PC board is that the relative positions of the electrodes typically require great precision because prior art touchpad sensing circuitry does not have large manufacturing error tolerances. This intolerance to manufacturing irregularities is generally a function of the touchpad circuitry itself. Touchpad circuitry is inherently sensitive to electrical noise, electrode spacing, and other factors that inhibit the ability to accurately detect and determine the location of a pointing object on the touchpad surface.

For example, X and Y electrical traces are laid out in a very precise pattern or grid. The error tolerance (dynamic range) of all touchpad circuits known to the inventors are such that without a precise grid layout that can only be consistently achieved using a PC board, the touchpads will not function. In other words prior art touchpad are generally so sensitive that it is necessary to include a PC board for the touchpad sensing electrode grids inside the keyboard case if a touchpad is to be included.

In examining the construction of prior art keyboards which include a touchpad, the plastic sheets are typically moved out of the way or minimized in size in order to make room for a PC board that is used for the touchpad sensing electrodes. This is the case with the touchpad shown in FIG. 1. In FIG. 2, the larger size of the ergonomic keyboard allows a PC board to be included without major modifications, but still requires the use of a large PC board for the touchpad. It is also necessary to cut an aperture through the keyboard case to thereby expose the touchpad surface to the pointing object.

In addition to the inclusion of a PC board for the touchpad sensing electrode grids, it is necessary to include some means for connecting the electrical traces 32, 38 on the plastic sheets 30, 36, 40 to control circuitry. The control circuitry is mounted on PC boards inside the keyboard case. This connecter has to be relatively strong because of the nature of the materials being used.

For example, the ink used in the electrical traces can oxidize. Accordingly, a connecter is used which applies a relatively large amount of pressure to force the electrical traces against corresponding electrical traces on a PC board. This pressure typically overcomes the oxidation, but requires the extra hardware involved in making the pressure connection.

It would be an advantage over the prior art to provide a means for reducing the amount of PC board required for a touchpad that is mounted inside a keyboard case. It would be another advantage to improve the connection interface between a PC board and the plastic sheets of the keyboard. It would be another advantage to utilize the plastic sheets for the touchpad sensor electrodes of the touchpad, thereby reducing cost and complexity of the keyboard. Another advantage would be to provide a new way to mount the touchpad sensor electrodes to a keyboard case, regardless of the presence of the plastic sheets for the keyboard itself. Finally, it would be an advantage to provide the touchpad sensor electrodes on a flexible material such as the plastic or mylar sheets, to thereby enable the touchpad to conform to curved surfaces, such as the inside of a keyboard case.

OBJECTS AND SUMMARY OF THE INVENTION

It is an object of the present invention to provide a flexible surface on which the touchpad sensor electrodes are disposed, to thereby enable the surface of the touchpad to be disposed along arcuate surfaces.

It is another object to integrate a touchpad and a keyboard in a keyboard case, wherein the touchpad replaces PC board material normally used for the touchpad sensor electrodes, with the plastic sheets used in construction of the key sensing apparatus.

It is another object to improve the connection between a PC board and plastic sheets used for the touchpad sensing electrodes.

It is another object to eliminate a pressure connector and replace it with a more reliable and less costly connection device.

It is another object to reduce the cost of manufacturing keyboards by manufacturing the touchpad sensor electrodes using the conductive ink used for the electrical traces of the keyboard circuitry.

It is another object to enable the sensor electrodes to be manufactured using a relatively imprecise silk screening process by using touchpad circuitry which has a high degree of tolerance for variations in manufacturing.

It is another object to dispose the sensor electrodes on plastic sheets and then to secure the plastic sheets directly to the underside of a keyboard cover, thereby eliminating the need to cut a hole in the keyboard cover for a user to access the touchpad.

In a preferred embodiment, the present invention is a touchpad formed from the combination of a flexible and non-conductive material used for a touch-sensitive surface, and a PC board on which is mounted the touchpad circuitry, wherein touchpad sensing electrodes are disposed on the touch-sensitive surface by creating electrical traces formed from conductive ink, the touch-sensitive surface being capable of conforming to various arcuate surfaces, and being capable of sensing through a protective housing such that the touch-sensitive surface is protected, and does not come in direct contact with the pointing object.

In a first aspect of the invention, the touchpad is disposed within a keyboard having multiple layers of plastic sheets where electrical traces are disposed thereon using a conductive ink, wherein the touchpad sensor electrodes are disposed on the same plastic sheets, but which are extended into a touchpad area.

In a second aspect of the invention, a new connector couples the electrical traces of the plastic sheets to at least one separate PC board which includes keyboard or touchpad circuitry, so as to generate data regarding keystrokes and touchpad control.

In a third aspect of the invention, touchpad sensing electrodes are disposed on the plastic sheets using a low-cost process which inherently has low manufacturing tolerances such as silk-screening.

In a fourth aspect of the invention, manufacturing tolerances for disposing the touchpad sensing electrodes on the plastic sheets can be low because the circuitry which is driving the touchpad sensing electrodes has a significantly higher dynamic range built-in to its design.

In a fifth aspect of the invention, the touchpad sensing electrode are disposed on plastic sheets which are in turn disposed directly onto the underside of an arcuate top cover of a keyboard case.

In a sixth aspect of the invention, the touchpad circuitry and sensing electrodes are sufficiently sensitive to enable detection and tracking of a pointing object on the keyboard case directly above the touchpad sensing electrodes.

These and other objects, features, advantages and alternative aspects of the present invention will become apparent to those skilled in the art from a consideration of the following detailed description taken in combination with the accompanying drawings.

BRIEF DESCRIPTION OF THE DRAWINGS

FIG. 5A is an elevational view of a prior art connector between plastic sheets and a PC board, wherein a pressure connector is used to secure electrical connections therebetween.

FIG. 5B is a profile view of FIG. 5A.

FIG. 6 is an elevational profile view of a PC board having solder bubbles, and a plastic sheet that is connected to the PC board using an adhesive material.

FIG. 7 is a top elevational view of FIG. 6.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

The presently preferred embodiment of the invention is a touchpad formed from the combination of a flexible and non-conductive material used for a touch-sensitive surface, and a PC board on which is mounted the touchpad circuitry. The touch-sensitive surface is coupled to the touchpad circuitry mounted on the PC board using a novel connection system that does not rely on a pressure connector of the prior art.

One of the most advantageous aspects of the invention is the flexible touch-sensitive surface. This aspect is advantageous because the touch-sensitive surface can conform to arcuate surfaces. For example, an ergonomic keyboard often has a wrist rest. The wrist rest is a curved plastic surface below the keys. The present invention can advantageously be disposed underneath the curved wrist rest area without having to modify the keyboard case. This is because the touchpad of the present invention is also capable of sensing through non-conductive materials. Thus, the touchpad is protected under the hard plastic of the keyboard case, and conforms to the arcuate surface of the case.

Another advantageous aspect of the invention comes from the manner in which touchpad sensing electrodes are disposed on the touch-sensitive surface. Specifically, electrical traces are formed from conductive ink. This is the same conductive ink that is used to generate electrical traces for many prior art keyboard designs. Furthermore, although the process of silk-screening electrical traces onto plastic typically results in variations in spacings between them, these are tolerated by the touchpad circuitry of the present invention because of a large dynamic range.

The alternative embodiment of a keyboard that includes a built-in touchpad can share manufacturing processes that are used for creating the sensing grid for keys of the keyboard. The exact position of the touchpad in the keyboard is not particularly relevant in the present invention. It is only important that the plastic sheets on which electrical traces are disposed for the keys are extended outwards in a particular direction so that the touchpad sensing electrodes can also be disposed thereon. Accordingly, the touchpad is manufactured as an integral component of the plastic sheets used for the keyboard.

Figure 1:
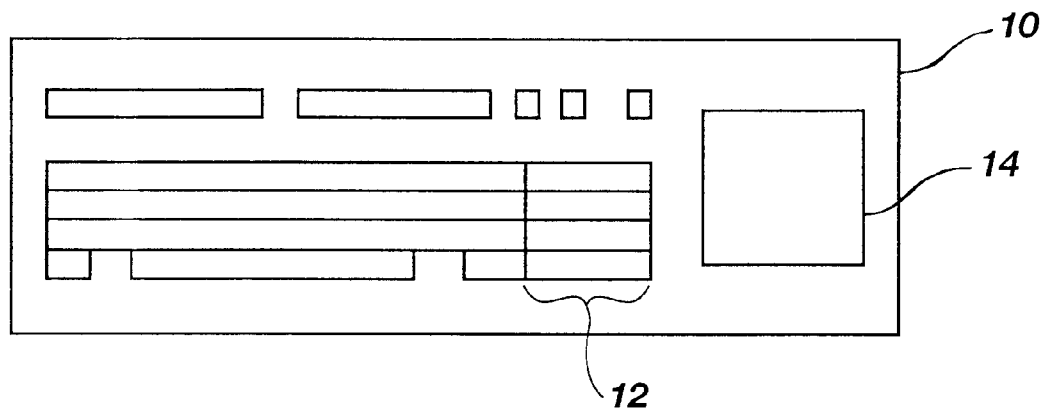
FIG. 1 is a top elevational view of a prior art keyboard having a touchpad included therein which is representative of the prior art in touchpad surfaces.
Figure 2:
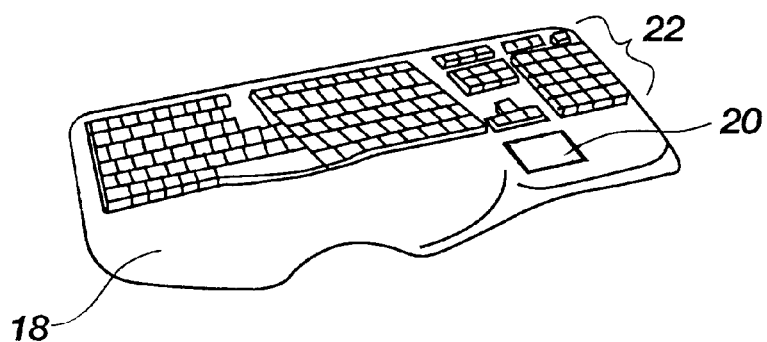
FIG. 2 is a perspective view of a prior art keyboard having a touchpad included therein which is representative of the prior art in keyboards having integrated touchpad surfaces from Cirque Corporation.
Figure 3:
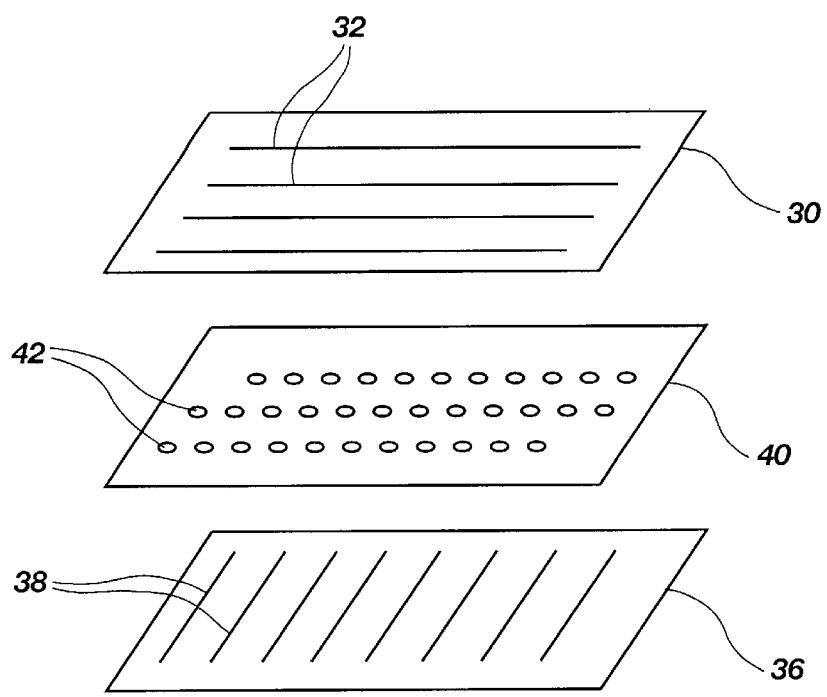
FIG. 3 is a perspective view of three plastic sheets used in construction of sensing electrodes used in prior art keyboard designs.
Figure 4:
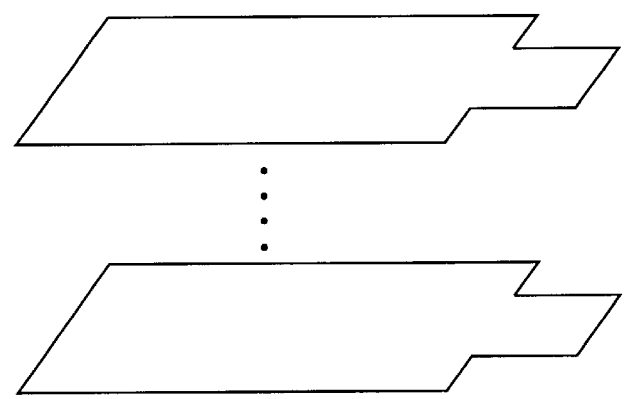
FIG. 4 is a perspective view of plastic sheets used in a keyboard which is made in accordance with the preferred embodiment of the present invention, and which includes space on the sheets for touchpad sensing electrodes of the touchpad to be disposed thereon.

Accordingly, FIG. 4 shows a perspective view of two plastic sheets which fit together in the same manner as the sheets of FIG. 3, with the addition of a smaller space off to a right edge which is to be used for the touchpad sensing electrodes. It should be apparent that the space reserved for the touchpad sensing electrodes can be at any arbitrarily selected location, just so long as it can be conveniently used as space for the touch-sensitive surface when a keyboard cover is disposed over the plastic sheets. Thus, it should be apparent that the extension in the plastic for the touchpad sensing electrodes can be manufactured in any direction. It is also an aspect of the invention that the plastic used for the touchpad sensing electrodes can also be manufactured as a separate article.

It is considered to be a novel aspect of the invention to use an inexpensive silk screening process, with its inherent imprecision in layout of the touchpad sensing electrodes as compared to using PC boards.

Another novel aspect of the invention is the ability to eliminate any supporting surface for the plastic sheets. This is accomplished by adhering the plastic sheets up against a bottom surface of a keyboard cover. There are several apparent advantages to this design, with the first being the elimination of a support surface. Another advantage is that the keyboard manufacturer can choose to highlight the area under which the touchpad is disposed if the touchpad technology is included, or not highlight the area if a touchpad is not included. The advantage to the seller is that the same keyboard cover can be used in both instances.

Typically, use of a touchpad in a keyboard case necessitates that a hole be cut in the keyboard top cover so that the user has access to the touchpad surface. However, the present invention can use, for example, the touchpad technology which is incorporated into capacitance-sensitive touchpads of CIRQUE CORPORATION(TM) which will still operate using keyboard top covers of average thickness. Accordingly, the keyboard top covers are easier to manufacture because the hole for the touchpad surface does not have to be cut or created using a mold with an aperture disposed therein.

Another novel aspect of the invention is the ability to eliminate the pressure connector that is used to apply pressure to the plastic sheets and the PC board where the control circuitry of the touchpads is mounted. A typical pressure connector is shown in FIGS. 5A and 5B, where a bar 50 is screwed down on top of at least one plastic sheet 52 and the PC board 54 in order to make a secure connection between them. Pressure is applied in this manner so that there is good electrical contact where the surfaces 56 of the plastic sheet 52 and the PC board 54 meet. Disadvantageously, screws 58 are required, as are holes into which the screws can be secured.

Eliminating the pressure connector is accomplished by first introducing solder bubbles. Solder bubbles 60 are preferably created on the PC board 62 as shown in FIG. 6. The solder bubbles 60 advantageously create an area that causes the plastic sheet 64 to bend in order to be secured to the PC board 62 in area 66. The plastic sheet 64 is secured to the PC board 62 by applying an adhesive to the PC board in area 66, to the plastic sheet 64 where it is on contact with the PC board 62, or both. As should now be understood, the raised solder bubbles 60 cause a greater force to be applied by the plastic sheet 62 where the plastic sheet is in contact with the solder bubbles simply because the plastic sheet is being bent. The stiffness of the plastic sheet 62 is sufficient to enable a good contact to occur.

FIG. 7 is provided to demonstrate that another novel feature of the invention is the staggering of the solder bubbles. While the spacing is visible in FIG. 6 in area 66 and creates the tension for a good connection, another purpose of the staggering is that the connections on the PC board are thus capable of being made closer together. FIG. 7 shows that the plurality of solder bubbles 60 are disposed in a staggered pattern.

Figure 8:
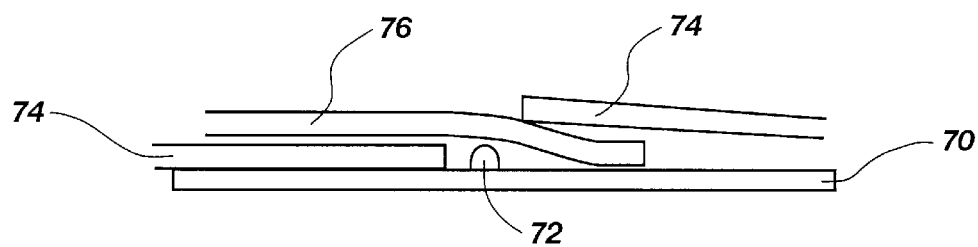
FIG. 8 is a first embodiment of how a solder bubble can be used to increase the effectiveness of an electrical connection between a PC board and touchpad sensing electrodes on a plastic sheet.
Figure 9:
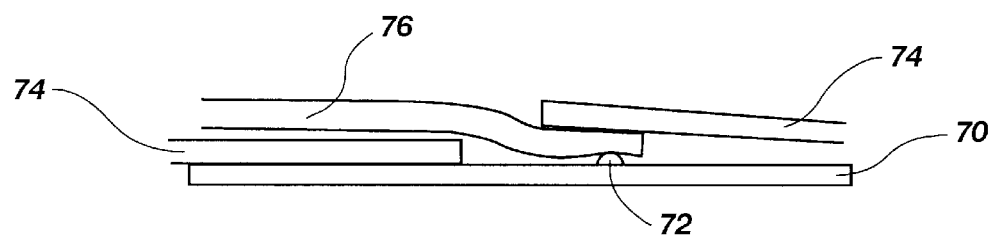
FIG. 9 is a preferred embodiment of an improvement over the design shown in FIG. 8.

FIG. 8 is provided to illustrate another method of connecting touchpad sensing electrodes on plastic sheets to electrical traces on a PC board. For example, suppose that a PC board is being used as a surface against which the touchpad sensing electrodes can rest. In one scenario, the touchpad sensing electrodes are disposed on two different plastic sheets. In a second scenario, one set of touchpad sensing electrodes is on the PC board, and the other set is on a plastic sheet. Either way, the touchpad sensing electrodes must be brought into electrical contact with the control circuitry mounted on a PC board. This is accomplished as shown in FIG. 8. A PC board 70 is being used as a substrate. Solder bumps 72 are disposed on the PC board 70. A first plastic sheet 74 is disposed on the PC board, with several holes cut therein to give access to the solder bumps 72 beneath. A second plastic sheet 76 with touchpad sensing electrodes thereon is to be put in contract with the solder bumps 72 of the PC board 70. A portion of the first plastic sheet 74 is raised and a portion of the second plastic sheet 76 is put underneath. However, it is possible that insufficient contact is made between the touchpad sensing electrodes on the second plastic sheet 76 and the solder bumps 72. To ensure a good electrical contact, the holes in the first plastic sheet 74 are not made over the solder bumps 72, but instead in front of them. In this way, the first plastic sheet 74 is still over the solder bumps 72, thus forcing the second plastic sheet 76 against the solder bumps 72.

Another aspect of the invention is the ability to use relatively inexpensive PC board material in these applications when the touchpad sensing electrodes are not being disposed thereon. The quality of the PC board can significantly affect the cost of the finished product. In this case, the material used for the PC board does not have to be high because the touchpad sensing electrodes no longer require such high precision when using CIRQUE CORPORATION (TM) touchpad control circuitry, thereby enabling the touchpad sensing electrodes to be silk screened onto the plastic sheets.

Another aspect of the invention is the ability to bend the plastic so that the touch-sensitive surface and the PC board having the control circuitry are both able to fit in a relatively small space. For example, consider a touchpad as shown in FIG. 10A.

Figure 10A:
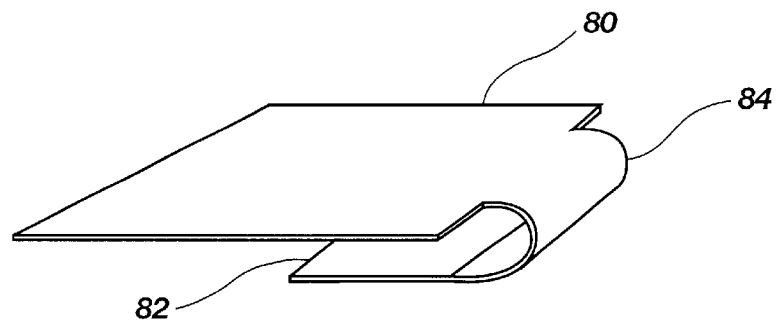

FIG. 10A is a perspective illustration of plastic sheets 80 on which are disposed touchpad sensing electrodes. The touchpad sensing electrode are disposed on bent or curved plastic sheets 84 to the PC board 82 which is aligned so as to be disposed underneath the plastic sheets 80 of the touch-sensitive surface. The plastic sheets 80 can be attached to the underside of a keyboard case or a standalone touchpad case, while the PC board is disposed directly underneath. One of the advantages of this arrangement is that the total area required to house the touchpad is reduced because instead of mounting the PC board to the side, it is disposed directly beneath the touchpad surface. It is only necessary to properly insulate the touch-sensitive surface from the touchpad circuitry so that they can be disposed relatively close. Accordingly, a standalone touchpad can be smaller when the PC board is disposed directly beneath the touch-sensitive surface.

Figure 10B:
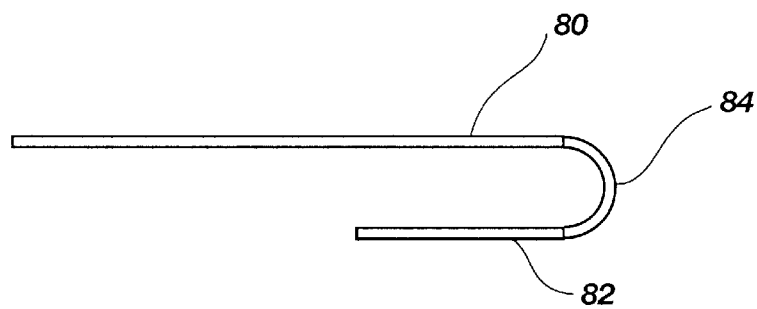

FIG. 10B is an elevational profile view of the FIG. 10A which shows the plastic sheets 80 of the touch-sensitive surface, the PC board 82 beneath, and the bent plastic sheets 84 that carry the touchpad sensing electrodes to the PC board.

Figure 10C:
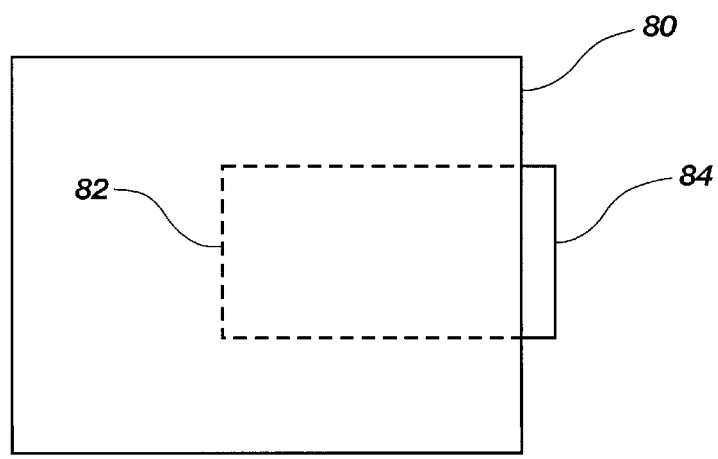

FIG. 10C is a top view of the FIG. 10A which shows the plastic sheets 80 of the touch-sensitive surface, the bent plastic sheets 84, and the outline of the PC board 82 disposed beneath the plastic sheets.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A touchpad for providing data input to a computer system by tracking movement of an object in contact with the touchpad, and which includes a flexible touch-sensitive surface that conforms to arcuate surfaces such that the flexible touch-sensitive surface is non-planar, said touchpad comprising:

at least two flexible and non-conductive sheets having at least three touchpad sensing electrodes disposed thereon, wherein the at least two flexible and non-conductive sheets overlap such that the at least three touchpad sensing electrodes form a grid which defines a touch-sensitive area of the touchpad, and wherein the at least two flexible and non-conductive sheets can bend to thereby conform to an arcuate surface such that the flexible touch-sensitive surface is not in a single plane, wherein movement of an object is detected and followed across the arcuate surface;

a printed circuit board; and touchpad control circuitry which is mounted on the printed circuit board, wherein the touchpad control circuitry is electrically coupled to the touchpad sensing electrodes so as to receive sensing information therefrom in order to detect contact of the object with the touchpad, track movement of the object across the touchpad, and removal of the object from the touchpad to thereby perform such a function as cursor control for the computer system, and wherein the touchpad control circuitry generates a plurality of signals that correspond to data input from the touchpad.

2. The touchpad as defined in claim 1 wherein the at least two flexible and non-conductive sheets are selected from the group of flexible and non-conductive sheets including plastic and mylar.

3. The touchpad as defined in claim 2 wherein the touchpad sensing electrodes are formed from conductive ink.

4. The touchpad as defined in claim 3 wherein the touchpad further comprises a connection system between the at least two flexible and non-conductive sheets and the touchpad circuitry on the printed circuit board, said connection system comprising:

a first non-conductive sheet secured to the printed circuit board;

a second non-conductive sheet partially secured to the printed circuit board, parallel to the first non-conductive sheet, and spaced apart therefrom to form a gap therebetween, wherein the second non-conductive sheet is not secured along the gap; and a row of solder bumps disposed underneath the second non-conductive sheet where it is not secured to the printed circuit board, parallel to and near an edge of the gap, wherein the portion of the at least two flexible and non-conductive sheets is disposed between the second non-conductive sheet and the row of solder bumps, and wherein touchpad sensing electrodes are in contact with the row of solder bumps.

5. The touchpad as defined in claim 3 wherein the touchpad further comprises a connection system between the at least two flexible and non-conductive sheets and the touchpad circuitry on the printed circuit board, said connection system comprising:

at least two rows of solder bumps disposed on the printed circuit board, wherein the at least two rows of solder bumps are spaced apart to form a gap therebetween; and a portion of the at least two flexible and non-conductive sheets disposed so as to cover the at least two rows of solder bumps, wherein the portion of the at least two flexible and non-conductive sheets that is disposed over the gap is secured to the printed circuit board so as to fill the gap, wherein the gap between the at least two solder bumps is sufficient to create tension on the portion of the at least two flexible and non-conductive sheets that is secured thereto.

6. The touchpad as defined in claim 5 wherein the touchpad further comprises an adhesive that is used to secure the portion of the at least two flexible and non-conductive sheets to the printed circuit board.

7. The touchpad as defined in claim 6 wherein the touchpad further comprises providing the at least two flexible and non-conductive sheets which have stiffness sufficient to create pressure to maintain electrical contact between touchpad sensing electrodes on the at least two flexible and non-conductive sheets, and the at least two rows of solder bumps.

8. The touchpad as defined in claim 7 wherein the touchpad further comprises staggering solder bumps within the at least two rows of solder bumps, such that a first row of solder bumps is offset from a second row of solder bumps, relative to the portion of the at least two flexible and non-conductive sheets.

9. A method for providing a touchpad having a flexible touch-sensitive surface that is coupled to arcuate surfaces, said method comprising the steps of:
  (1) providing a flexible touch-sensitive surface that is non-planar and that conforms to arcuate surfaces formed from at least two flexible and non-conductive sheets coupled together and having touchpad sensing electrodes disposed thereon, a printed circuit board, and touchpad control circuitry which is mounted on the printed circuit board, wherein the touchpad control circuitry is electrically coupled to the touchpad sensing electrodes so as to receive sensing information therefrom, and wherein the touchpad control circuitry generates a plurality of signals that correspond to data input from the touchpad;
  (2) disposing the flexible touch-sensitive surface against a mounting surface, wherein the mounting surface is sufficiently thin to thereby enable the flexible touch-sensitive surface to detect a pointing object on an opposite side thereof; and
  (3) detecting and tracking the pointing object that touches and moves along the opposite side of the mounting surface by using the touchpad control circuitry to detect contact of the pointing object with the opposite side of the mounting surface, track movement of the pointing object, and removal of the pointing object to thereby perform such a function as cursor control for a computer system.

10. The method as defined in claim 9 wherein the method further comprises the step of securing the flexible touch-sensitive surface against the mounting surface using a non-conductive adhesive.

11. The method as defined in claim 10 wherein the method further comprises the step of selecting the at least two flexible and non-conductive sheets from the group of flexible and non-conductive sheets including plastic and mylar.

12. The method as defined in claim 11 wherein the method further comprises the step of forming the touchpad sensing electrodes from conductive ink.

13. The method as defined in claim 12 wherein the method further comprises the steps of:
  (1) securing a first non-conductive sheet to the printed circuit board;
  (2) partially securing a second non-conductive sheet to the printed circuit board, parallel to the first non-conductive sheet, and spaced apart therefrom to form a gap therebetween, wherein the second non-conductive sheet is not secured along the gap; and
  (3) providing a row of solder bumps underneath the second non-conductive sheet where it is not secured to the printed circuit board, parallel to and near an edge of the gap, wherein the portion of the at least two flexible and non-conductive sheets is disposed between the second non-conductive sheet and the row of solder bumps, and wherein touchpad sensing electrodes are in contact with the row of solder bumps.

14. The method as defined in claim 12 wherein the method further comprises the step of providing a connection system between the at least two flexible and non-conductive sheets and the touchpad circuitry on the printed circuit board that does not rely upon a pressure connector.

15. The method as defined in claim 14 wherein the method further comprises the step of utilizing a non-conductive adhesive to secure the portion of the at least two flexible and non-conductive sheets to the printed circuit board.

16. The method as defined in claim 15 wherein the method further comprises the step of staggering solder bumps within the at least two rows of solder bumps, such that a first row of solder bumps is offset from a second row of solder bumps, relative to the portion of the at least two flexible and non-conductive sheets.

17. The method as defined in claim 14 wherein the method further comprises the steps of:
  (1) providing at least two rows of solder bumps on the printed circuit board, wherein the at least two rows of solder bumps are spaced apart to form a gap therebetween, and
  (2) securing a portion of the at least two flexible and non-conductive sheets so as to cover the at least two rows of solder bumps, wherein the portion of the at least two flexible and non-conductive sheets that is disposed over the gap is secured to the printed circuit board so as to fill the gap.

* * * * *